United States Patent [19]
Levis

[11] Patent Number: 5,345,243
[45] Date of Patent: Sep. 6, 1994

[54] CONTINUOUS-WAVE REFLECTION TRANSMISSOMETER WITH TARGET DISCRIMINATION USING MODULATED TARGETS

[75] Inventor: Curt A. Levis, Columbus, Ohio

[73] Assignee: The Ohio State University Research Foundation, Columbus, Ohio

[21] Appl. No.: 49,630

[22] Filed: Apr. 19, 1993

Related U.S. Application Data

[63] Continuation of Ser. No. 441,233, Nov. 22, 1989, abandoned, which is a continuation of Ser. No. 310,250, Feb. 13, 1989, abandoned, which is a continuation of Ser. No. 41,458, Apr. 23, 1987, abandoned.

[51] Int. Cl.[5] .............................................. G01S 7/10
[52] U.S. Cl. ........................................ 342/173; 342/6; 342/26
[58] Field of Search ..................... 342/6, 165, 173, 22, 342/26; 73/170.29, 170.31, 170.34; 359/523; 356/437, 447, 448; 455/106

[56] References Cited

U.S. PATENT DOCUMENTS 4,283,725  8/1981  Chisholm ............................ 342/6 X

*Primary Examiner*—Tod R. Rohm
*Attorney, Agent, or Firm*—Frank H. Foster

[57] ABSTRACT

The attenuation of electromagnetic waves by a transmission medium is detected or measured by directing a continuous periodic electromagnetic wave toward a reflector. The reflector is modulated to modulate the electromagnetic wave as it is reflected. The reflected wave is received and an output signal related monotonically to the power of the modulated reflected wave is detected. The output signal is then compared to the output signal which is or would be obtained under various other transmission conditions.

18 Claims, 7 Drawing Sheets

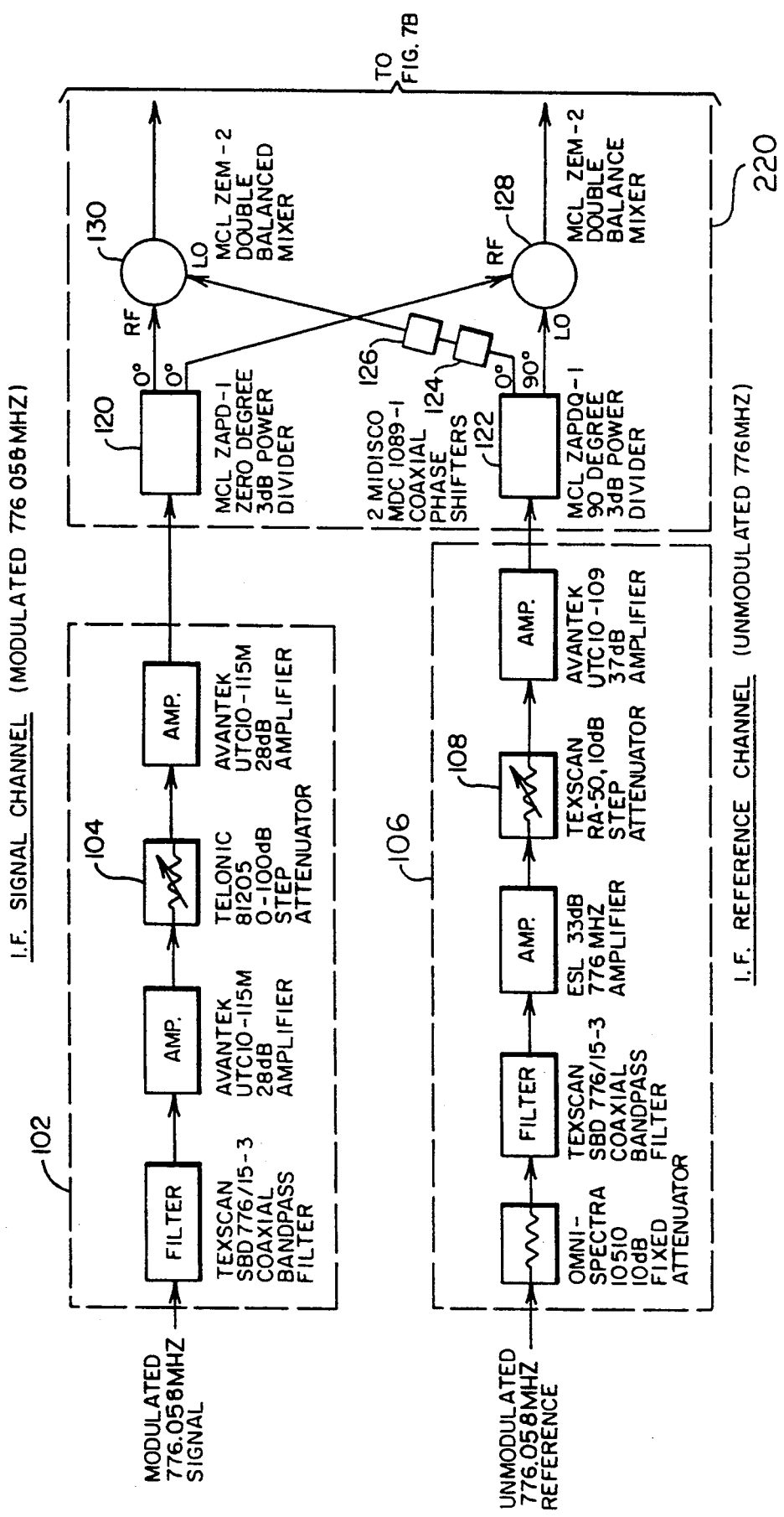

CONTINUOUS-WAVE REFLECTION TRANSMISSOMETER WITH TARGET DISCRIMINATION USING MODULATED TARGETS

This invention was made with government support under Contract No. F33615-81C-1437 awarded by The Air Force. The government has certain rights in the invention.

This application is a continuation of application Ser. No. 07/441,233, filed Nov. 22, 1989, now abandoned, which is a continuation of application Ser. No. 07/310,250, filed Feb. 13, 1989, now abandoned, which is a continuation of application Ser. No. 07/041,458, filed Apr. 23, 1987, now abandoned.

TECHNICAL FIELD

This invention relates generally to electronic instrumentation for use with communications, radar, and imaging systems and more particularly relates to an instrument for measuring the attenuation of electromagnetic radiation at frequencies at which such systems operate under a variety of transmission conditions.

BACKGROUND ART

In radar, telecommunications, and imaging systems a portion of the radiated and reflected electromagnetic energy is lost or attenuated in the transmission medium, e.g., in the atmosphere which contains absorbing gases and distributed water in the form of rain, sleet, snow or fog. Consequently, for the design, evaluation, and operation of such systems it is desirable to measure the attenuation caused by particular transmission conditions. A transmissometer is a device for measuring the transmission loss resulting from existing transmission conditions along a predetermined path through the transmission medium.

To measure attenuation, a known method is to radiate electromagnetic radiation from a transmitting antenna or source at a specified power along a predetermined path to a target from which the radiation is reflected back to a receiver near the transmitting antenna or source. The transmissometer system delivers a signal which is monotonically related to the power of the reflected signal which is received at the receiver. The target-reflected power must be detected independently of its phase, and the detection must not include reflections from other objects. The power reflected from the target may then be compared to the power reflected from the target under other, known transmission conditions, e.g., under lossless conditions, so that the attenuation under the existing transmission condition can then be determined.

Two types of such reflection transmissometers have been previously known. One is an ungated reflection transmissometer and the other is a radar transmissometer.

In ungated reflection transmissometers, electromagnetic energy is radiated as a continuous wave, either modulated or unmodulated, and the energy reflected from the target is detected and a signal monotonically related to its power is obtained. If the transmitted continuous wave is modulated, certain parts of the receiver circuitry may operate at the modulation frequency or its harmonics by using conventional frequency shifting. Additionally, radiation from other interfering sources at the transmitter frequency can be excluded from the receiver detector circuitry.

The problem with a continuous wave ungated transmissometer is that it is unable to distinguish between energy reflected from the intended target and energy reflected from other targets. Thus, energy received at the receiver, which was reflected from unknown or undesired targets is a source of error. For any given target, the received reflected power decreases as the reciprocal of the fourth power of the distance between target and transmissometer even in the absence of attenuation by the transmission medium. Therefore even small targets near the transmissometer produce large signals, and the sensitivity of ungated reflection transmissometers is limited by near-by reflections, e.g., by ground clutter. In addition, this system can only be used with a single target and thus multiple targets spaced at different ranges from the transmitting antenna can not be used. Therefore, previously existing continuous wave transmissometers do not allow the attenuation at multiple, different ranges to be measured concurrently.

However, continuous wave transmissometers do have the advantage that the radiated energy is radiated over a relatively long duty cycle, on the order of all or half of the entire observation time. This permits the use of a relatively low-power transmitter and eliminates the need for the precision range gating circuitry which is required in radar systems. As a result, ungated reflection transmissometers are simpler and may be less expensive than radar transmissometers.

Radar transmissometers have been used in order to distinguish one target from another and therefore exclude reflections from targets which are outside the design range interval or "range gate". They also permit the simultaneous use of multiple targets. With radar transmissometers, each desired target is identified and distinguished, as in conventional radar, by the time its reflection returns to the receiver. Thus, radar transmissometers can exclude some of the clutter reflections and permit the simultaneous measurement of attenuation at different ranges from several spaced targets. This is an important advantage of radar transmissometers over ungated transmissometers because of the nonuniform attenuation which can occur from changes in the medium with distance, such as is common in the atmosphere in the case of localized precipitation.

Radar transmissometers, however, like ungated continuous wave transmissometers still cannot discriminate against ground clutter or other significant reflections which occur within the range gate of the radar system.

Additionally, a radar system requires the radiation of a very high-power, electromagnetic wave over a short time interval. The pulse must be short to allow effective discrimination between the desired target and others, and the power must be high in order to cause sufficient reflected energy to be received at the receiver and detected during the observation time. Although discrimination against undesired targets and ground clutter can be improved by shortening the range gate time interval, this causes the ratio of observation time to total available time to be shortened, which in turn requires still higher transmitter power to achieve the required signal-to-noise ratio. In addition, of course, the radar transmissometer requires the complex and possibly expensive range gating circuitry.

These requirements can be avoided, at the cost of additional complexity, by the use of pulse-compression or "chirp" radar techniques. However, such systems require swept-frequency sources which are generally more expensive, and which are unavailable in many frequency ranges of interest.

BRIEF DISCLOSURE OF INVENTION

In the present invention a continuous periodic electromagnetic wave is radiated from a transmitter toward a target of the reflection transmissometer. However, the effective radar cross section of the reflecting target is modulated, such as by periodically varying its reflectivity, thereby causing the incident electromagnetic waves to be modulated as they are reflected. The reflected waves are received from the reflecting target and a signal is detected which is monotonically related to the power of the modulated reflected wave which is incident upon the receiving antenna. Thus, reflections from the desired modulated targets can be distinguished from reflections from all other targets. The detection sensitivity is enhanced further by using a coherent system in which the modulating signal is utilized at the detector.

One advantage of this system is that it obtains the advantages of both the radar transmissometer and the continuous wave transmissometer and has none of their disadvantages. The system of the present invention is able to discriminate reflections coming from the modulated targets from reflections coming from clutter; therefore it does not have the sensitivity limitation of ungated reflection transmissometers which do not use target modulation. Embodiments of the present invention are also able simultaneously to use multiple targets modulated by different waveforms, e.g., at different frequencies. The present invention is able to eliminate ground clutter and other reflections which originate within the approximate range of the targets as well as from without. In addition, the system is continuous wave and therefore does not have the high power requirements of a pulsed radar system, does not require the expensive precision gating circuitry of such radar systems or the swept-frequency sources and complex signal processing of pulse-compression radars.

Figure 1:
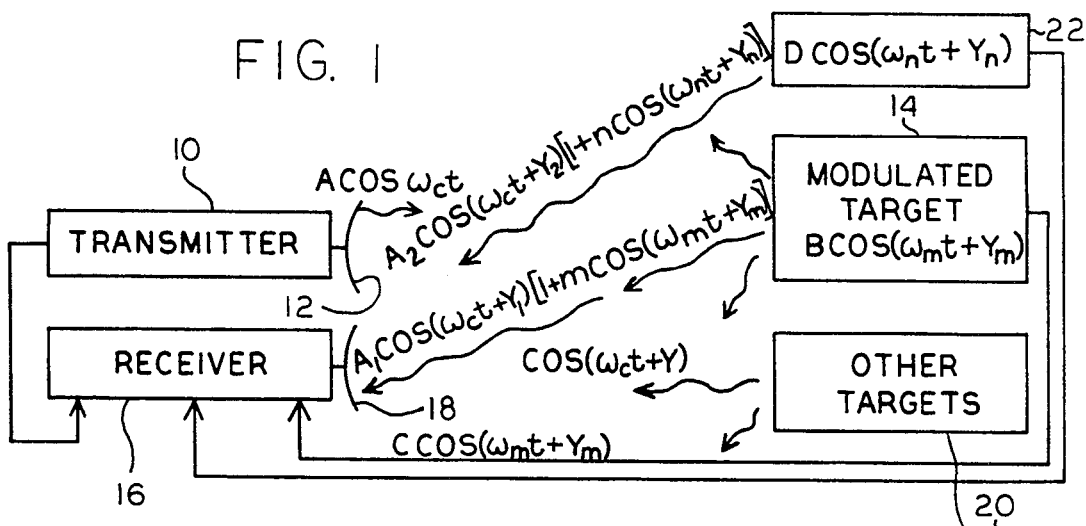
FIG. 1 is a simplified block diagram illustrating the present invention.

In describing the embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose. For example, the word "connected" or terms similar thereto are often used. They are not limited to direct connection but include connection through other circuit elements where such connection is recognized as being equivalent by those skilled in the art.

DETAILED DESCRIPTION

A simplified diagram illustrating a transmissometer embodying the present invention is illustrated in FIG. 1. A transmitter 10 connected to its directive antenna 12 radiates a continuous electromagnetic wave, for example at 94 GHz. The energy is directed toward at least one modulated, reflective target 14. The target 14 includes some means for periodically modulating its reflective properties so that electromagnetic waves which are reflected from it are modulated. For example, the target can be modulated so that the amplitude of the reflected energy varies periodically. In the figure, the transmitted wave is shown for simplicity as an unmodulated sinusoidal wave at angular frequency $w_c$ and the target modulation is indicated for the sake of simplicity as being sinusoidal amplitude modulation with angular frequency $w_m$. In practice, the transmitted wave might also be modulated, and the target-modulating waveform is likely to be more complicated, and frequency or phase modulation may also be employed to modulate the reflected wave by means of the target. The modulation can be accomplished in a variety of ways, some examples of which are discussed below, including the simple rotation of a large flat plate about an axis which is normal to the radial propagation from the transmitting antenna 12 to the target 14.

As illustrated in FIG. 1, the reflected energy will be modulated so that, as is well known in the communication art, it will include upper and lower side bands spaced above and below the carrier frequency by a frequency interval equal to the modulating frequency. A signal proportional to the modulated reflected electromagnetic radiation can then be detected in the receiver in accordance with known modulation detection principles.

Reflections from other targets indicated as 20 will ordinarily not be modulated and are unlikely to include reflections or emissions at the same sideband frequencies. Ordinarily such reflections will include only reflections at the carrier frequency $w_c$. Thus, in accordance with conventional communication detection principles, all the unmodulated reflections can be rejected by filters and a signal proportional to the power of the energy reflected by the modulated target 14 to the antenna 18 can be detected in the receiver 16.

In addition, multiple reflectors, such as a second reflector 22, can be modulated each with a different waveform. For example, reflector 22 can be modulated at a different frequency $w_n$ so that, for example, reflections from it will contain sidebands representing the sum and difference frequencies of the carrier and its modulating frequency $w_n$. Ordinarily such other targets would be spaced at different ranges from the transmitting antenna 12 for detecting attenuation along different paths or at different ranges along a path. The receiver is then provided with circuitry for detecting separately the signals modulated at the frequencies corresponding to each modulated target, so that a separate signal for each target can be obtained in the receiver 16 which is independent of both the electromagnetic waves reflected from other modulated targets as well as from other undesired targets.

In addition, it is desirable to couple the modulating signal or a signal derived from it, or a signal from which it is derived, to the receiver so that the desired modulation can be detected in a coherent system.

Target modulation may be accomplished in a variety of different ways, some of which have been suggested in connection with navigation systems in the prior art. In addition to amplitude modulation, which is accomplished by changing the amplitude of the energy reflection periodically, the power reflected from the target may also be frequency modulated and the receiver will then use frequency modulation detection techniques. For example, a target may be modulated by rotating it so that a component of its motion periodically reciprocates along a line joining the radiating antenna and the reflector. Thus, the reflector effectively reciprocates along this line so that the reflected wave is Doppler shifted alternately above and below the radiated wave frequency $w_c$. Or, the frequency modulation can, for example, be accomplished by rotating a paddle wheel arrangement about an axis which is normal to a radial from the transmitting antenna 12.

Additionally, the electrical properties of the reflector can be periodically varied by using an electrical or electronic circuit means, such as a dipole antenna, at the reflector and periodically varying its electrical properties, such as by periodically varying a component of this electrical or electronic circuit to modulate the reflected waves.

In the case of amplitude target modulation, a quadrature detector may be used in order to detect a signal monotonically related to the power of the reflected wave which has been modulated by the target and to do so independently of the RF phase of the received signal.

Figure 2:
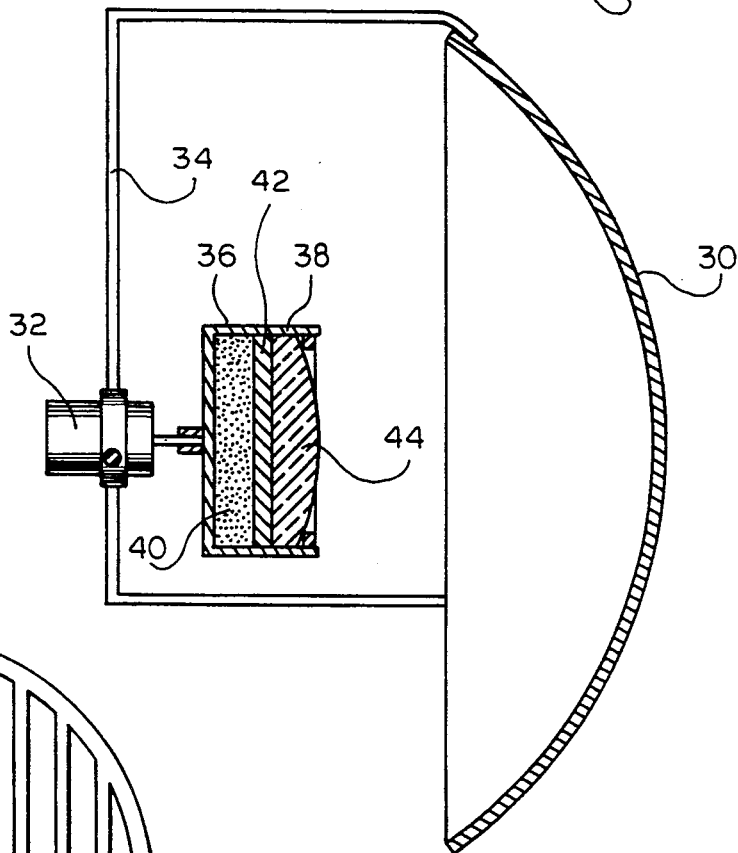
FIG. 2 is a view in section of a modulated target for use in embodiments of the invention. The plane of the section includes the line joining the target and the transmitter/receiver of the transmissometer.
Figure 3:
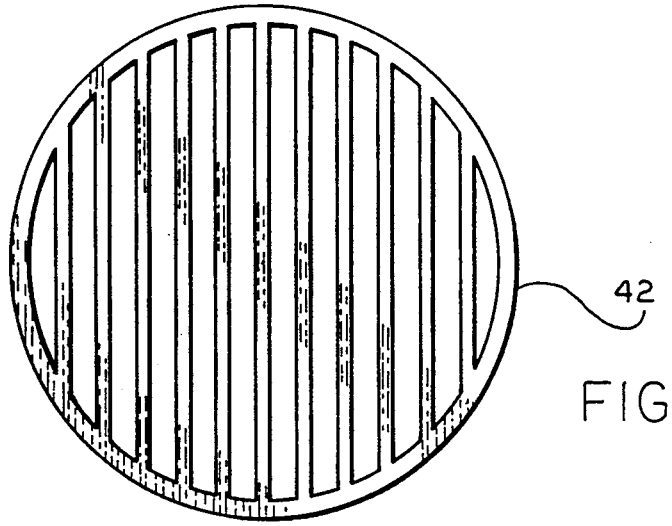
FIG. 3 is a view of a polarization sensitive reflector used in the target of FIG. 2, as seen from the direction of the transmitter/receiver.
Figure 4:
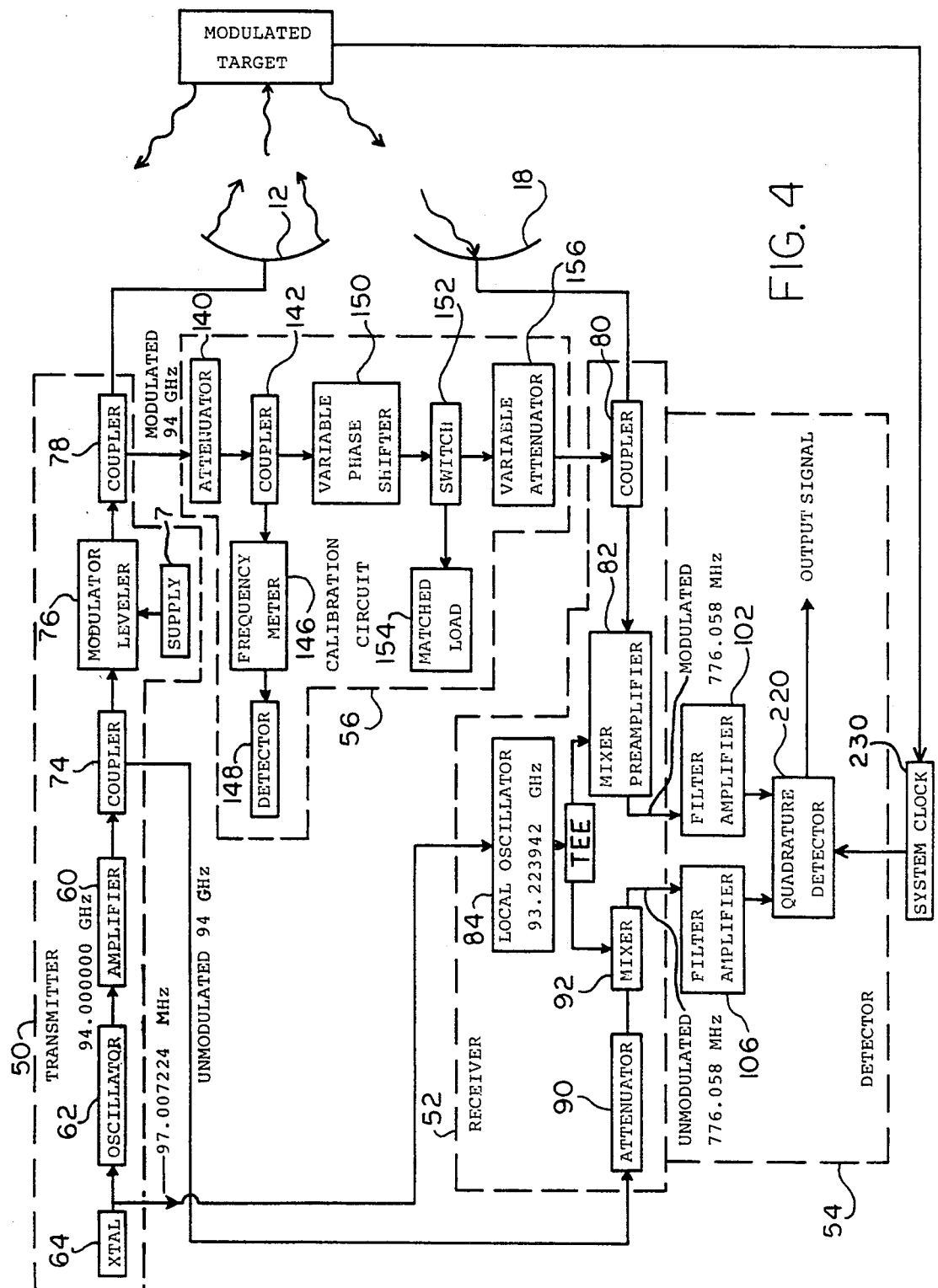
FIG. 4 is a block diagram illustrating an embodiment of the present invention for frequencies near 94 GHz.
Figure 5:
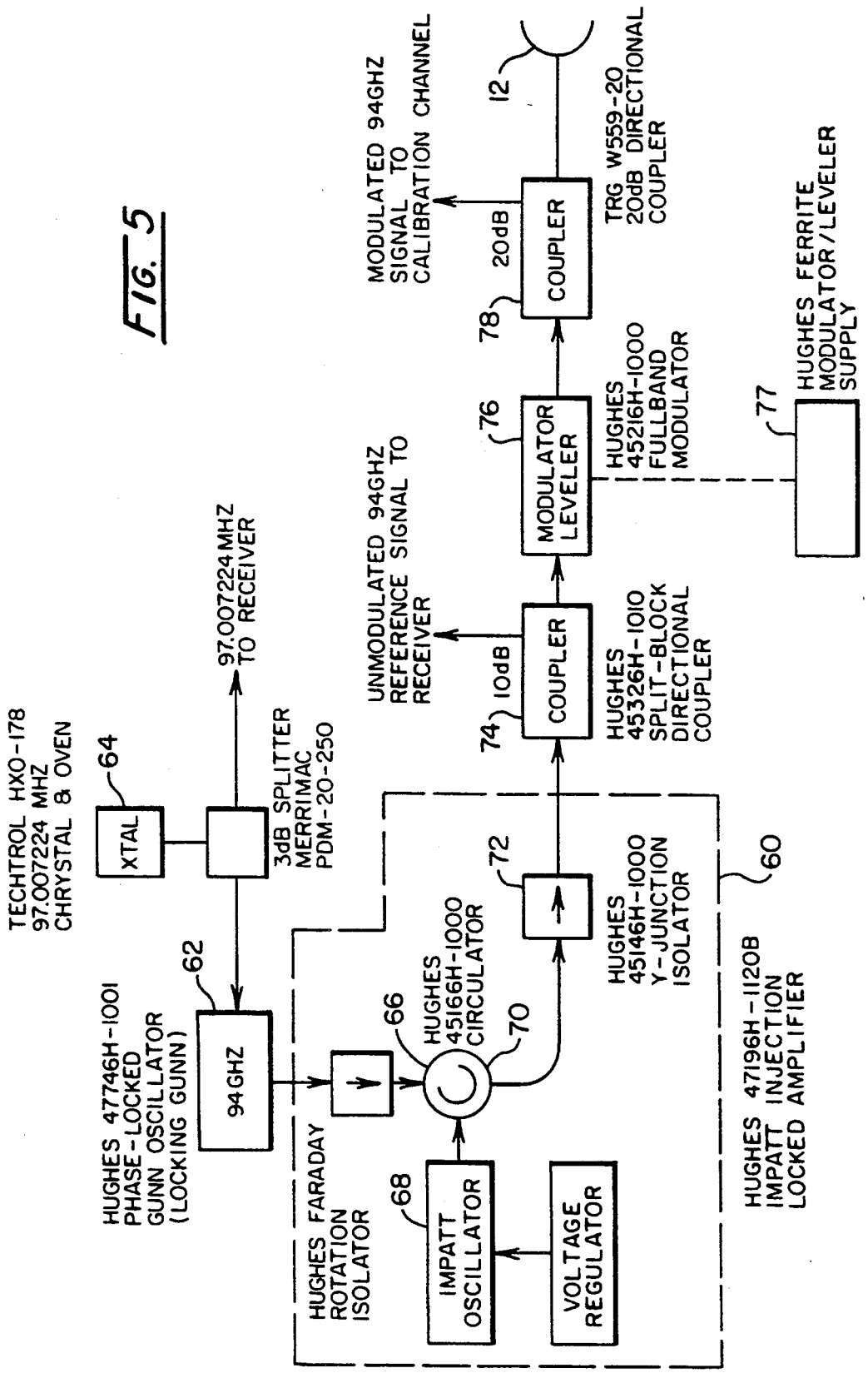
FIG. 5 is a block diagram showing in more detail the transmitter portion of the embodiment illustrated in FIG. 4.
Figure 6:
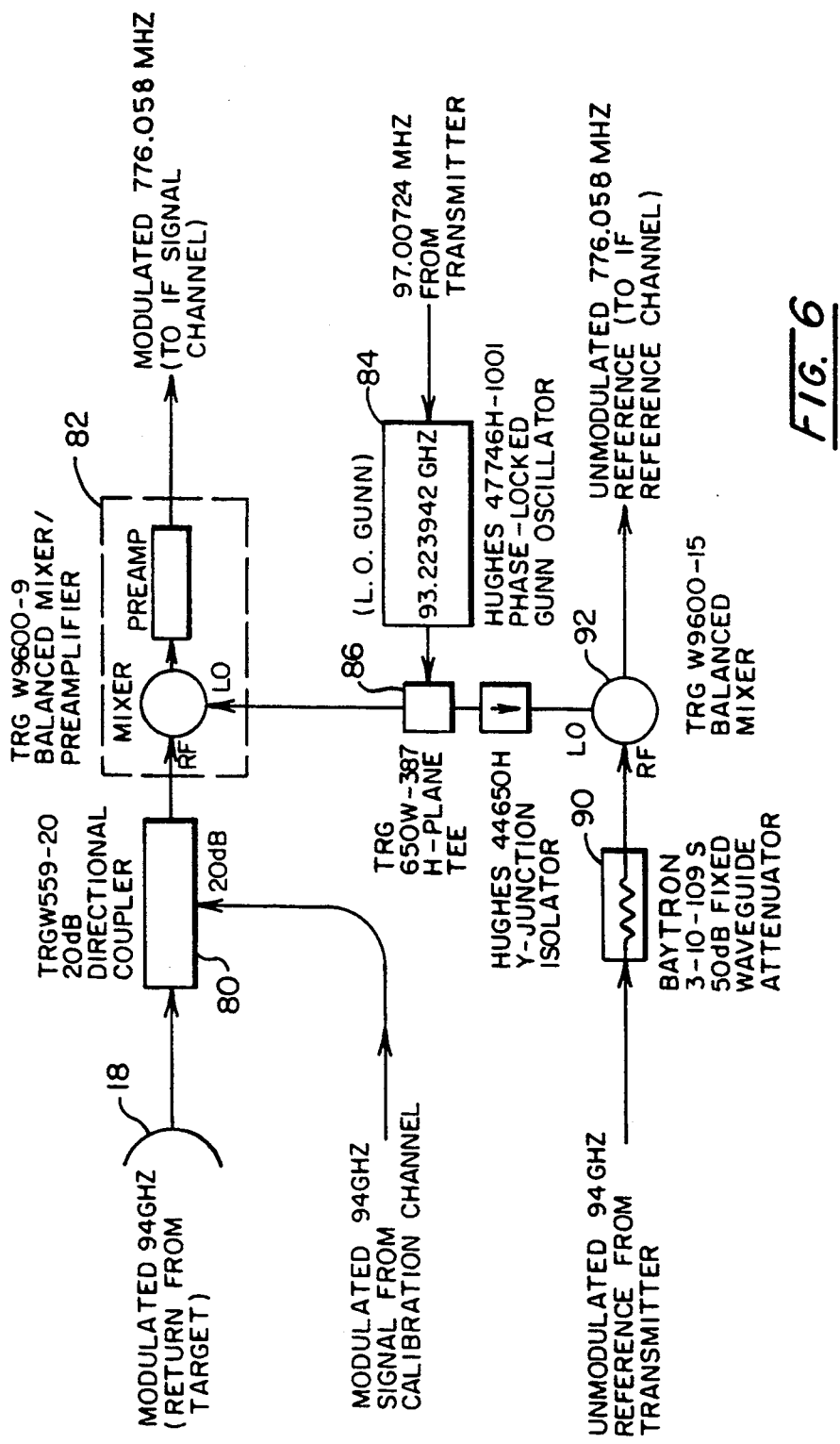
FIG. 6 is a block diagram illustrating in more detail the radio-frequency section of the receiver portion of the embodiment illustrated in FIG. 4.
Figure 7B:
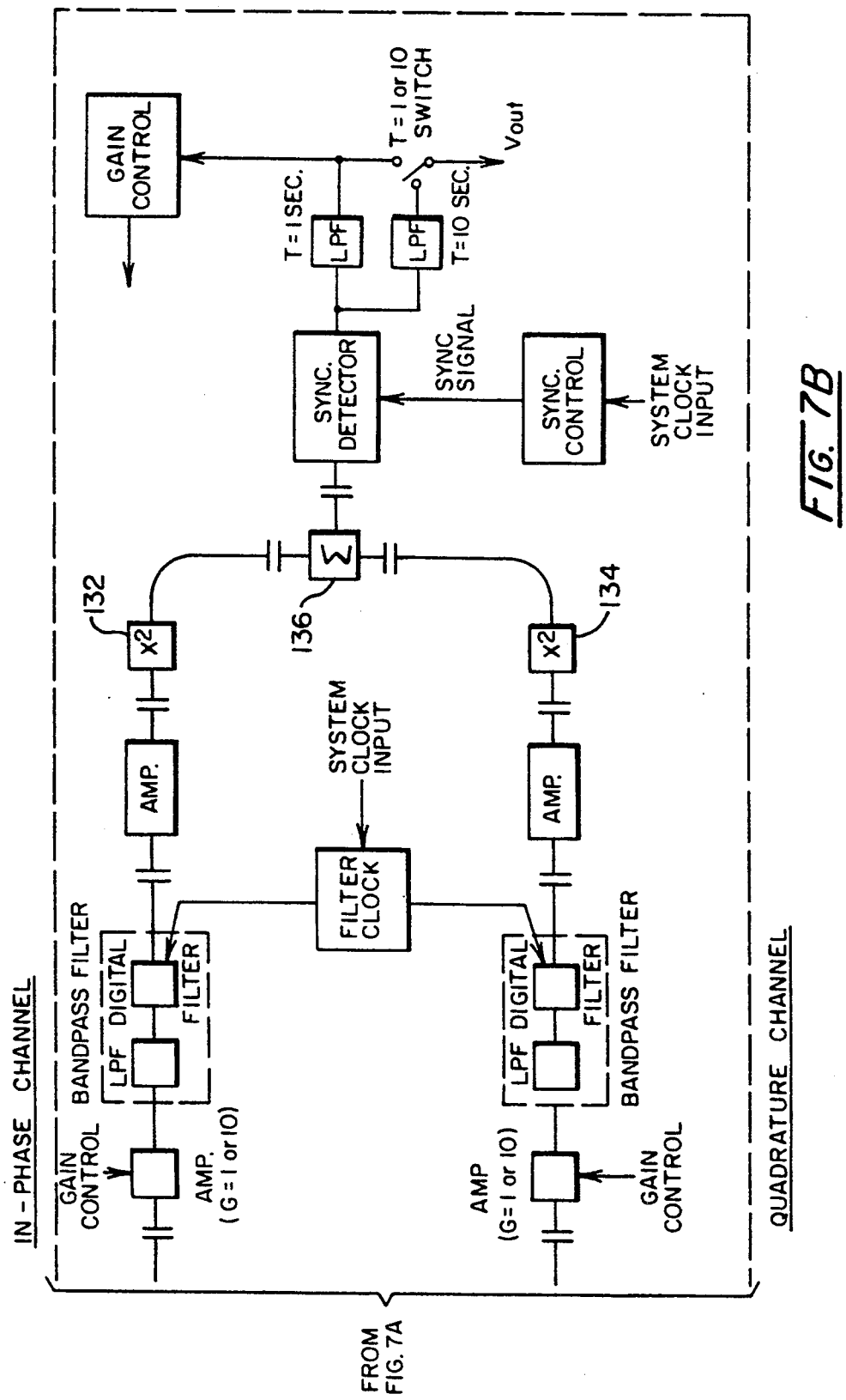
FIG. 7 is a block diagram illustrating in more detail the intermediate frequency and detector portion of the embodiment of the invention illustrated in FIG. 4.
Figure 8:
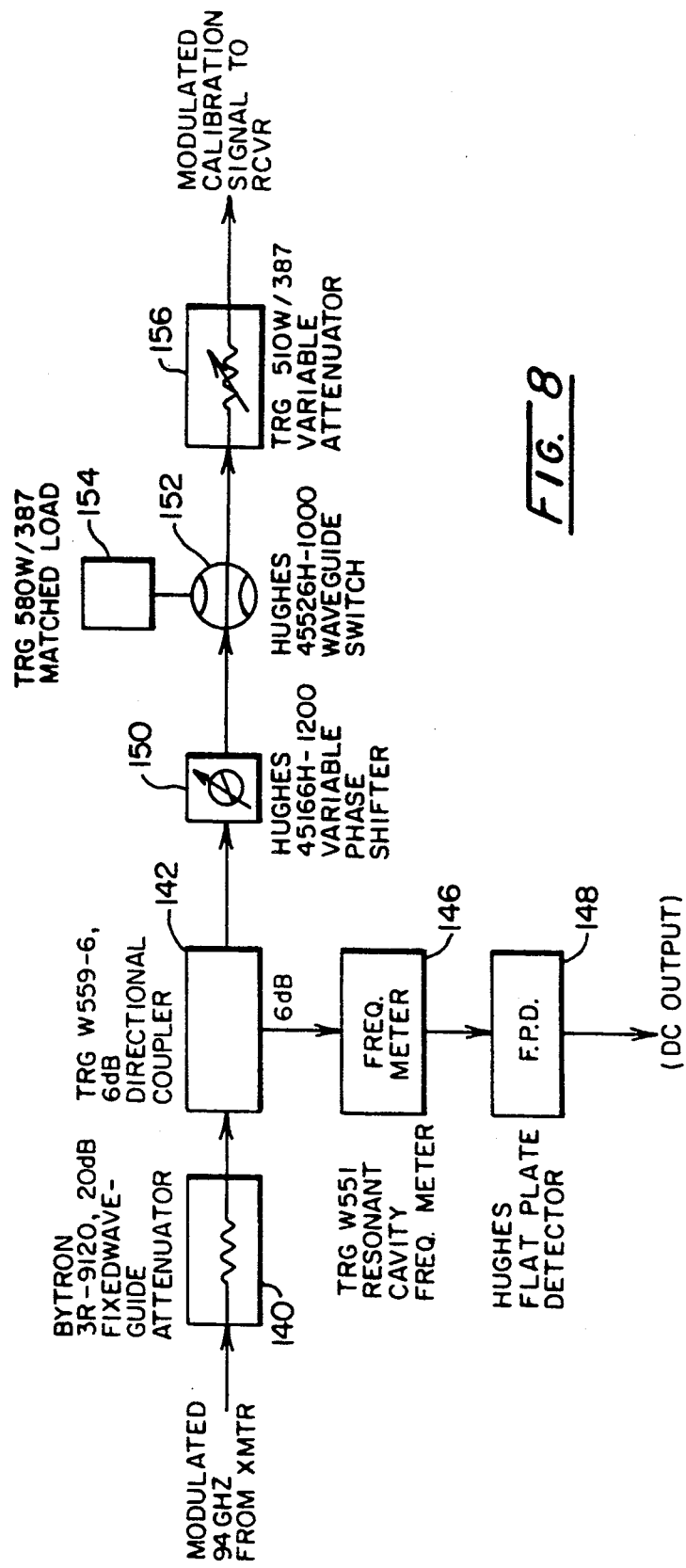
FIG. 8 is a block diagram illustrating in more detail the calibration circuitry of the embodiment of the invention illustrated in FIG. 4.

FIGS. 2 and 3 illustrate a modulated target for use in embodiments with the present invention. FIG. 2 illustrates a parabolic reflector 30 having a synchronous motor 32 mounted to it by suitably spaced support arms, such as support arm 34, and operating, for example, at 400 revolutions per second. The motor is connected to drive in rotation, a polarization sensitive reflecting unit 36. When, during rotation, the unit 36 is at its angular orientation for maximum reflection, electromagnetic energy which is incident upon the parabolic reflector 30 is reflected to the polarization sensitive reflector and reflected from it back to the parabolic reflector and returned to the target at a maximum amplitude. However, when the polarization sensitive reflector 36 is orthogonally positioned at its position of minimum reflection, then less energy is reflected and more is absorbed in the unit 36.

In particular, the unit 36 comprises an outer cylindrical housing 38 having a microwave absorber 40, a polarization sensitive reflector 42, illustrated in more detail in FIG. 3, and a dielectric lens 44. The reflector 42 comprises a plurality of parallel conductors which are connected at their terminal ends as illustrated in FIG. 3. It may, for example, be constructed of copper sheet configured in the manner of FIG. 3 with the parallel conductors spaced less than one quarter wavelength apart.

FIGS. 4–8 illustrate in more detail the construction of an embodiment of the invention. Referring to those figures, the transmissometer comprises a transmitter section 50, a calibration section 56 and a receiver section 52 which includes an intermediate frequency and detection section 54.

A high power, 200 milliwatt continuous wave injection-locked impatt amplifier 60 is injection locked by a highly stable but lower power, 10 milliwatt, 94 GHz phase-locked Gunn oscillator 62. The Gunn oscillator is controlled and its stability is maintained by use of a highly stable 97.007224 MHz crystal 64 to which it is locked. The injection-locked impatt amplifier 60 is injection locked by applying the 94.000000 signal from the Gunn oscillator through a Faraday rotation isolator which protects the Gunn oscillator 62 from possible signal reflection or leakage from the high power impatt injection locked amplifier 68. The Gunn signal then passes through a circulator 70 to injection lock the impatt amplifier 68 to 94.000000 GHz. An isolator 72 protects the impatt oscillator 68 and the Gunn oscillator 62 from damage by signal reflections.

A 10 dB coupler 74 is used to tap off an unmodulated 94 GHz reference signal which is applied to the local oscillator of the receiver section 52. The remaining signal is applied through a modulator/leveler 76 which furnishes modulation for calibration purposes, but not during the actual measurement operation of this particular embodiment of the invention. The modulating frequency for calibration is in the range of 600 Hz to 1300 Hz. During normal operation of the transmissometer for detecting the power of waves reflected from a target, the modulator/leveler may be used, if required, to level the signal and to remove any amplitude modulation. A power supply 77 supplies power to the modulator leveler 76.

The levelled signal is applied to a 20 dB coupler 78 which is connected to the calibration section 56. This provides the calibration section with a modulated 94 GHz signal for use in the receiver during calibration. The remaining signal is then applied to the transmitting antenna 12.

Four RF signals are applied to the receiver. One is the reflected signal from the receiving antenna 18. The unmodulated 94 GHz reference signal is applied from the coupler 74 and, for calibration purposes, the modulated 94 GHz signal from the calibration section, which was derived from the coupler 78, is also applied. The fourth is the 97.007224 MHz signal from the crystal 64.

The signal from the receiving antenna 18, which has been attenuated during propagation along the transmission path, modulated and phase shifted, is applied through a coupler 80 to a mixer preamplifier 82. The 97.007224 MHz signal from the crystal 64 is used to generate a 93.223942 GHz local oscillator signal. This local oscillator signal is applied through a splitting Tee 86 to the mixer 82 where it is mixed with the reflected signal from the coupler 80. The mixing provides a frequency translation down to an intermediate frequency of 776.058 MHz.

The unmodulated 94 GHz signal from the coupler 74 is applied through an attenuator 90 to a mixer 92 where it is also mixed with the 93.223942 GHz local oscillator signal from the local oscillator 84. This provides an unmodulated reference signal at 776.058 MHz, the frequency-translated carrier frequency (intermediate frequency) of the reflected signal.

The modulated intermediate frequency signal from the mixer amplifier 82 is then applied to a filter/amplifier 102. The filter/amplifier includes a step attenuator 104 to adjust the signal levels to assure that neither the noise nor the signal saturates the IF amplifiers.

Similarly, the unmodulated signal from the mixer 92 is applied to a filter/amplifier 106 which also includes a step attenuator 108 for the same purpose. These two IF signals, one a reference signal at the frequency-shifted carrier frequency and the other the frequency-shifted carrier modulated by the target, are then applied to a quadrature detector 220.

The modulated IF signal and the reference IF signal are applied to power dividers 120 and 122 respectively. The power divider 122 additionally introduces a 90 degree phase shift into one of its outputs which is then applied to a mixer 128, where it is mixed with a portion of the split signal from the power divider 120 to provide the quadrature channel of the quadrature detector. The other output from the power divider 122 is applied to the mixer 130 where it is mixed with an output from the power divider 120 to provide the in-phase channel of the quadrature detector. Phase shifters 124 and 126 are fine adjustments used to set the phase difference between the two channels to precisely 90 degrees.

The output signals from mixers 128 and 130 contain the target-modulation waveform. In the embodiment described here, the target of FIGS. 2 and 3 was driven at a rate of 400 revolutions per second controlled by a system clock 230. Since the target is symmetrical, each revolution produces two cycles of signal modulation; the principal component of the modulation waveform is therefore 800 Hz. Other components are removed by bandpass filtering, while the 800 Hz components are amplified and then squared in squaring circuits 132 and 134. They are then applied to summing circuit 136.

In accordance with well known quadrature detector technology, the output of the summing circuit 136 provides a signal which has DC and 1600 Hz components which are proportional to the power of the received modulated signal and independent of its phase. The DC component is more subject to drifting and can be shown to contain more noise; it is therefore removed by a blocking capacitor at the output of summing circuit 136, and the 1600 Hz component is applied to one input of a synchronous detector whose other input is 1600 Hz derived from the system clock 230. The resulting DC voltage is proportional to the power of the target-modulated RF wave which is incident upon the receiving antenna 18.

In the calibration section 56, the signal from the coupler 78 is applied in the calibration section to an attenuator 140 for signal level control and then applied to a directional coupler 142. A portion of the signal is tapped off at the coupler 142 and applied to a frequency meter 146 and then to a flat plate detector 148, the output of which might be applied to the modulator leveler 76 to maintain the signal from the modulator leveler 76 at a constant amplitude, although this may not be required.

The other output from the coupler 142 is applied through a variable phase shifter 150, used for fine adjustment, and a wave guide switch 152 connected to a matched load 154. The wave guide switch 152 is used to turn off the calibration section during operation of the preferred embodiment of the invention after it has been calibrated. The signal is then applied to a variable attenuator 156 used to control calibration signal amplitude.

While certain embodiments of the present invention have been disclosed in detail, it is to be understood that various modifications may be adopted without departing from the spirit of the invention or scope of the following claims. The principles of the present invention are also applicable to reflections of other types of wave energy at other frequencies and in other transmission media. For example, the invention is applicable to characterizing the transmission quality of ocean water in an optical, underwater imaging system.

I claim:

1. A method for measuring the attenuation of electromagnetic radiation along a transmission path through a propagation medium under conditions of unknown attenuation, said method comprising:
   (a) positioning an antenna, a transmitter and a receiver at one end of the transmission path many wavelengths long;
   (b) positioning an electromagnetic energy reflector at the other end of the transmission path;
   (c) radiating continuously a periodic, continuous electromagnetic wave from the antenna toward said reflector;
   (d) periodically modulating the reflection properties of the electromagnetic energy reflector to thereby modulate the incident periodic, electromagnetic waves;
   (e) receiving the wave reflected from the reflector;
   (f) detecting a signal which is monotonically related to the power of the received modulated reflected wave;
   (g) performing steps (a) through (f) under conditions of know attenuation; and
   (h) comparing the signals detected in step (f) under conditions of unknown attenuation and step (g) under conditions of known attenuation to determine the relative attenuation.

2. A method in accordance with claim 1 wherein the detected signal is at least a part of that component of the radiated wave which has been modulated by the reflector.

3. A method in accordance with claim 2 wherein coherent detection is employed using a reference signal which is coherent with respect to the modulation of the reflection properties.

4. A method in accordance with claim 3 wherein the coherent detection occurs in a second detector of a superheterodyne receiver.

5. A method in accordance with claim 4 wherein a reference intermediate frequency signal for the second detector is obtained from the transmitter through a mixing process identical to that by which a target-modulated intermediate frequency signal for that detector is obtained from the received signal, so that both a reference intermediate carrier frequency and a received-signal intermediate carrier frequency will be identical even when the transmitter frequency drifts, allowing coherent detection of the modulation.

6. A method in accordance with claim 2 wherein a signal derived from a signal used in producing the target modulation is utilized to detect the desired modulated signal component coherently.

7. A method in accordance with claim 3 wherein the coherent detection is accomplished utilizing a detection reference signal and a reflector modulation signal both synthesized from a common signal.

8. A method in accordance with claim 1 wherein there are a plurality of reflectors each being differently modulated and wherein the power of the modulated reflected wave from each reflector is separately detected.

9. A method in accordance with claim 1 wherein a reflector property is modulated by periodically modifying its apparent physical configuration or position so as to modulate the 10. A method in accordance with claim 9 wherein the reflector includes a polarization sensitive reflector the reflective properties of which are modulated by rotation at a modulating frequency.

11. A method in accordance with claim 1 wherein a reflector property is modulated by periodically moving at least a portion of the reflector in a manner that a component of its motion periodically reciprocates along a line joining the radiating antenna and the reflector.

12. A method in accordance with claim 1 wherein an electric or electronic circuit means is connected at the reflector and its electrical properties are periodically changed to modulate the reflection properties of the reflector.

13. A method in accordance with claim 1 wherein a quadrature detector is used to detect the reflected wave power.

14. A reflection transmissometer for detecting the attenuation of electromagnetic radiation through a propagation medium at a selected frequency, said transmissometer comprising:

(a) a transmitter for radiating continuously a periodic, continuous, electromagnetic wave at the selected frequency;

(b) an electromagnetic energy reflector in the path of the radiated wave, substantially larger than a wavelength of said transmitted wave, spaced at least many wavelengths from the transmitter and oriented to reflect a portion of the radiated wave, said reflector including a modulator for periodically modulating the reflection properties of the reflector and thereby causing the reflected wave to be modulated; and (c) a receiver positioned to receive the reflected wave for detecting a signal related monotonically to the power of the received, modulated wave.

15. An apparatus in accordance with claim 14 wherein the receiver includes a mixer, one input to said mixer being connected to apply the reflected signal to the mixer and the other input being a signal at least partially coherent with the transmitted signal, so that the difference frequency output obtained from said mixer is substantially independent of the transmitted frequency.

16. An apparatus in accordance with claim 14 including a coherent or synchronous detector which has applied to one input a signal derived from the reflected wave, while the other input is a signal at least partially coherent with respect to the modulated target reflection properties.

17. An apparatus in accordance with claim 14 wherein an electrical or electronic circuit means is connected at said reflector and wherein means for periodically varying at least one electrical component of the electrical or electronic circuit is provided for the purpose of varying the reflection properties of the reflector.

18. An apparatus in accordance with claim 14 wherein the reflector has drive means drivingly connected to it for driving at least a portion of the reflector in a periodic motion so as to modulate the reflection properties of the reflector periodically.

* * * * *

UNITED STATES PATENT AND TRADEMARK OFFICE
CERTIFICATE OF CORRECTION

PATENT NO. :     5,345,243
DATED      :     September 6, 1994
INVENTOR(S) :    Curt A. Levis It is certified that error appears in the above-indentified patent and that said Letters Patent is hereby corrected as shown below:

Column 6, line 10, "94.000000" should read --94.000000 GHz--.
Column 9, claim 9, line 2, should read --to modulate the reflected wave--.

Signed and Sealed this

Thirty-first Day of January, 1995

Attest:

BRUCE LEHMAN

Attesting Officer        Commissioner of Patents and Trademarks